United States Patent [19]
Jang et al.

[11] Patent Number: 6,069,831
[45] Date of Patent: May 30, 2000

[54] SEMICONDUCTOR READ-ONLY MEMORY WITH SELECTION CIRCUITRY FOR ROUTING DUMMY MEMORY CELL DATA TO MEMORY CELL MAIN BIT LINES

[75] Inventors: Cheol-Ung Jang; Byeng-Soon Choi, both of Suwon, Rep. of Korea

[73] Assignee: Samsung Electronics Co., Ltd., Rep. of Korea

[21] Appl. No.: 09/103,964

[22] Filed: Jun. 24, 1998

[30] Foreign Application Priority Data

Jun. 25, 1997 [KR] Rep. of Korea .................. 97-27269

[51] Int. Cl.⁷ ................................................ G11C 7/02
[52] U.S. Cl. ............... 365/210; 365/189.07; 365/230.06
[58] Field of Search ................. 365/210, 189.07, 365/230.06

[56] References Cited

U.S. PATENT DOCUMENTS

| | | | |
|---|---|---|---|
| 5,148,063 | 9/1992 | Hotta | 307/530 |
| 5,268,861 | 12/1993 | Hotta | 365/104 |
| 5,349,563 | 9/1994 | Iwase | 365/230.01 |
| 5,383,160 | 1/1995 | Furuyama | 365/221 |
| 5,469,397 | 11/1995 | Hoshino et al. | 365/210 |
| 5,502,681 | 3/1996 | Park | 365/210 |
| 5,659,503 | 8/1997 | Sudo et al. | 365/185.2 |
| 5,694,369 | 12/1997 | Abe | 365/210 |
| 5,886,937 | 3/1999 | Jang | 365/203 |

*Primary Examiner*—David Nelms
*Assistant Examiner*—Hien Nguyen
*Attorney, Agent, or Firm*—Samuels, Gauthier & Stevens LLP

[57] ABSTRACT

A semiconductor read-only memory includes a main memory cell array having a plurality of first and second bit lines arranged in a hierarchical configuration. A dummy cell array generates a reference potential during a read-out operation. A decoder circuit generates a first, second, third and fourth selection signals from address signals, and a sense amplifier circuit detects data stored in a memory cell of the main memory cell array. A switching circuit connects the dummy cell to the sense amplifier circuit through the second bit line. The read-only memory according to the invention has an advantage that it is possible to accomplish an efficient read-out operation without additional dummy bit lines in an area of the memory cell array.

4 Claims, 12 Drawing Sheets

(Prior Art)

(Prior Art)

SEMICONDUCTOR READ-ONLY MEMORY WITH SELECTION CIRCUITRY FOR ROUTING DUMMY MEMORY CELL DATA TO MEMORY CELL MAIN BIT LINES

FIELD OF THE INVENTION

The invention is in the field of read-only memories (ROM) and is more specifically related to a NOR-type masked ROM having an address transition detecting (ATD) function, a hierarchical bit line architecture and a plurality of memory cells formed of metal-oxide-semiconductor field effect transistors (MOSFETs) connected in parallel between bit lines and ground lines.

BACKGROUND OF THE INVENTION

Figure 1:
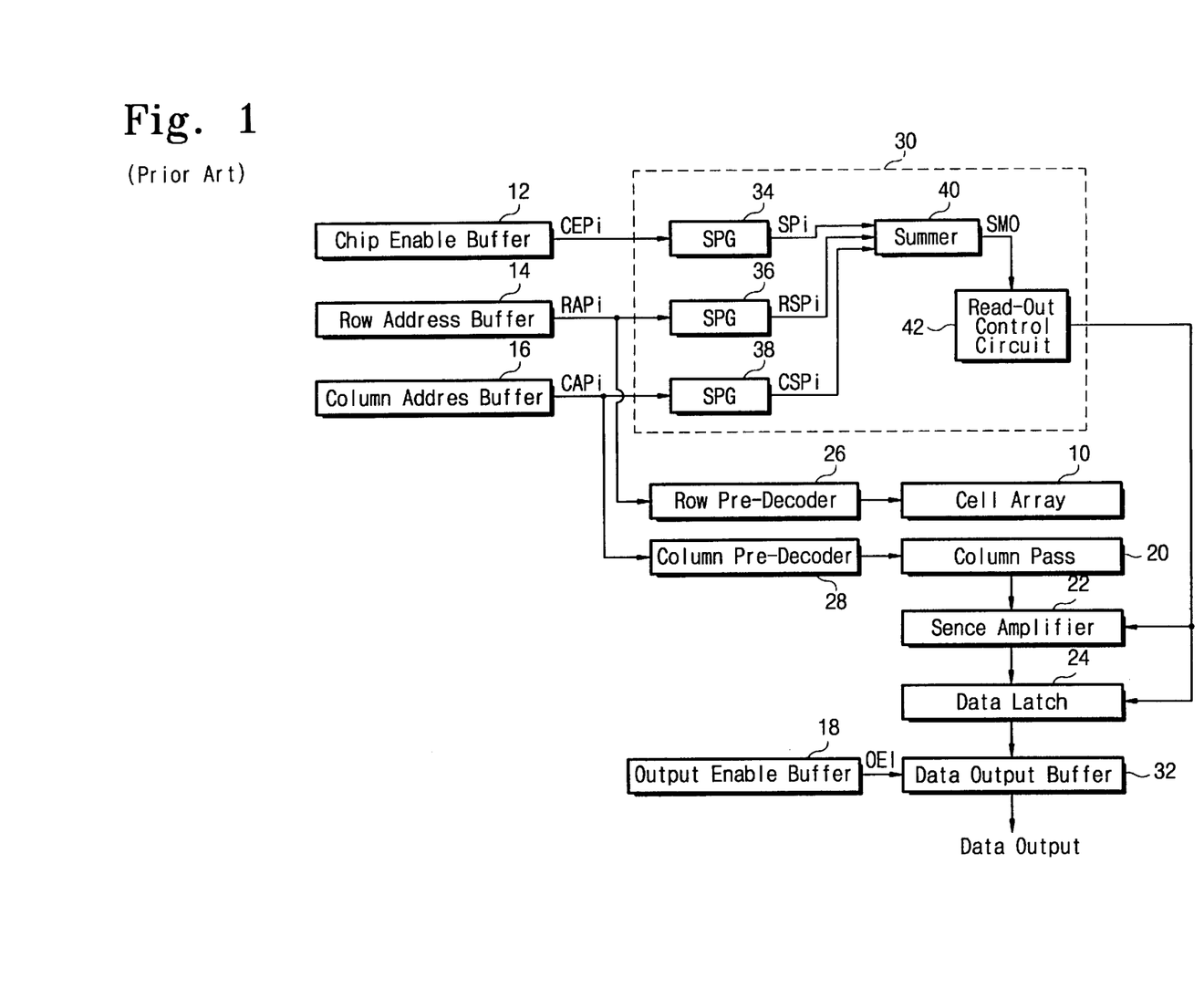
FIG. 1 is a schematic block diagram illustrating a conventional read-only memory employing an address transition detecting function.

FIG. 1 is a schematic block diagram of a typical ROM device employing an address transition detection (ATD) function. The ROM device includes a memory cell array 10, input buffer circuits 12, 14, 16 and 18, column pass circuit 20, sense amplifier circuit 22, data latch circuit 24, row pre-decoder circuit 26, column pre-decoder circuit 28, ATD circuit 30, short pulse generation circuits 34, 36 and 38, summer 40, and read-out control circuit 42.

Input buffers 12, 14, 16 and 18 receive a chip enable signal, row address signals, column address signals and an output enable signal, respectively, from external circuitry, and convert those external signals into corresponding internal signals CEPi, RAPi, CAPi, and OEi, respectively. Row address signals RAPi and column address signals CAPi generated from row address buffer 14 and column address buffer 16, respectively, are applied to row and column pre-decoders, 26 and 28, respectively, for selecting specific memory cells in cell array 10. Chip enable signal CEPi, row address signals RAPi and column address signals CAPi, from input buffers 12, 14, and 16, are applied to short pulse generation circuits 34, 36, and 38 in ATD circuit 30. Short pulse generation circuit 34 generates and outputs a short pulse signal SPi when the chip enable signal changes states to a high or low state. The short pulse generation circuits 36 and 38 each generate and output short pulse signals RSPi and CSPi, respectively, when at least one of address signals is in a transition state to high or low.

The output pulses of the short pulse generation circuits 34, 36, and 38 are applied to summer 40, which converts the short pulses into one pulse signal SM0 with a predetermined pulse width. The signal SM0 is transferred to the read-out control circuit 42 which generates a precharge control signal PRE and sense-amp control signal SACS in response to the pulse signal SM0 from summer 40.

A precharging operation for bit lines can be performed while the precharge control signal PRE is at an active voltage level. Sense amplifier circuit 22 detects and magnifies voltage levels of data stored in cells of the cell array 10 selected by the pre-decoder circuits 26 and 28, and then transfers the sensed signals to data latch circuit 24. The data held in latch circuit 24 is transferred out of the memory chip through data output buffer circuit 32.

Figure 2:
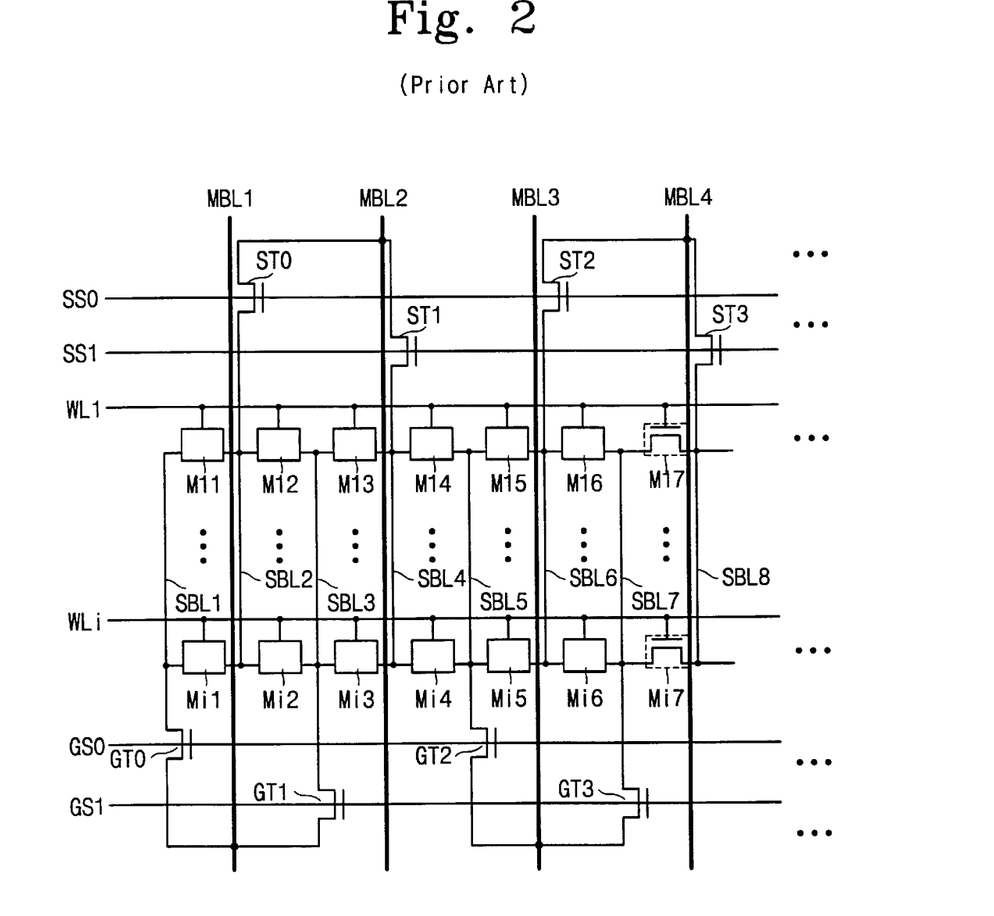
FIG. 2 is a detailed schematic block diagram of a cell array of the read-only memory of FIG. 1.

FIG. 2 contains a detailed schematic block diagram of the cell array 10 of FIG. 1. The bit lines are hierarchically composed of main bit lines (MBLs) formed of a conductive metal and sub bit lines (SBLs) formed of a diffused layer. Each of the main bit lines is assigned to two of the sub bit lines, and the sub bit lines are divided in two groups of odd-numbered bit lines and even-numbered bit lines. Memory cells Mmn (m=1,2, . . , I; n=1,2 . . . , I) are coupled to word lines WL1–WLi and the sub bit lines, the gates of the memory cells being connected to the word lines and the drains of the cells being connected to the sub bit lines, in a NOR-type logic, as shown in detail on cells M17 and Mi7. The memory cells may be selectively programmed in a high threshold state of "1" or "off" or in a low threshold state of "0" or "on". The even-numbered sub-bit lines are connected to even-numbered main bit lines through string selection transistors ST0, ST1, . . . . The gates of the transistors ST0, ST1, . . . are coupled to string selection lines SS0 and SS1. The odd-numbered sub-bit lines are connected to odd-numbered main bit lines through ground selection transistors GT0, GT1, . . . . The gates of the transistors GT0, GT1, . . . are coupled to ground selection lines GS0 and GS1.

Figure 3:
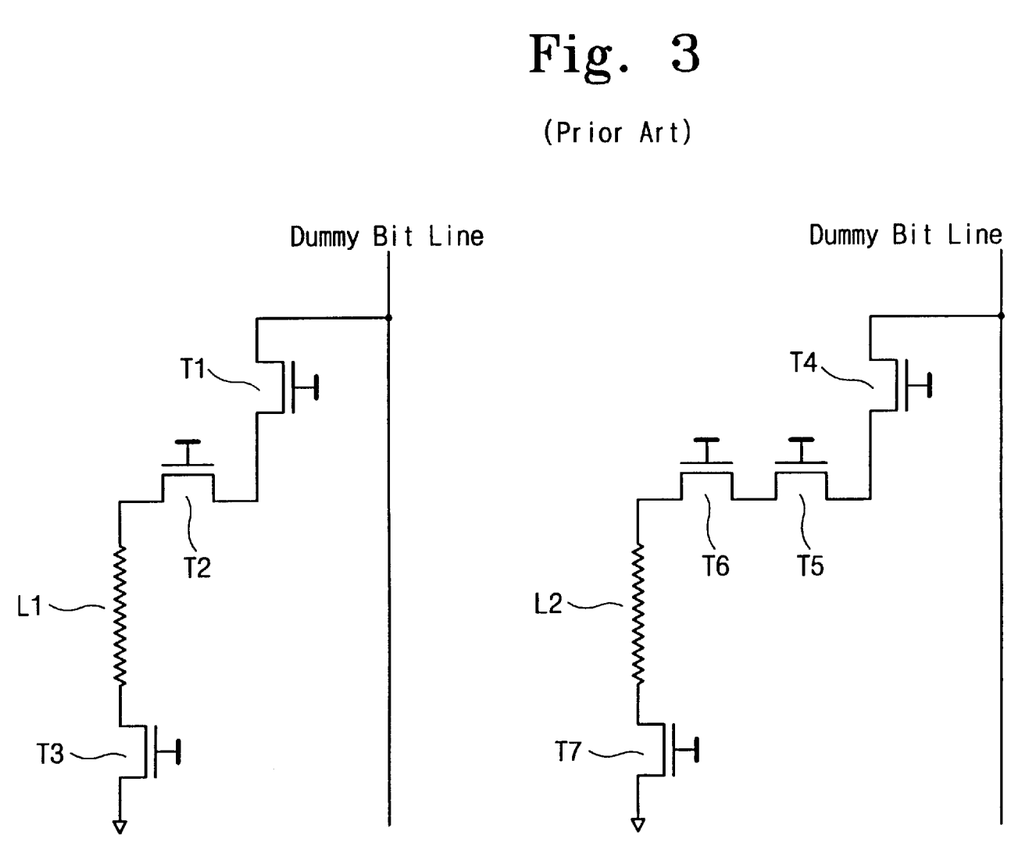
FIG. 3 is a detailed schematic block diagram of a configuration of a dummy cell array in the read-only memory FIG. 1.

FIG. 3 contains a detailed schematic block diagram of a configuration of a dummy memory cell in the cell array 10 of FIG. 1. NMOS transistors T1 and T4 correspond to the string selection transistors ST0, ST1, . . . , of FIG. 2. NMOS transistors T2, T5 and T6 correspond to the memory cells Mmn of FIG. 2. The resistances on lines L1 and L2 correspond to the resistances of the sub-bit lines. The NMOS transistors T3 and T7 correspond to the ground selection transistors GT0, GT1, . . . . The dummy cell has current driving capability of half of that of the normal memory cell and is used to provide a reference potential when a corresponding memory cell is selected in a read-out operation.

Figure 4:
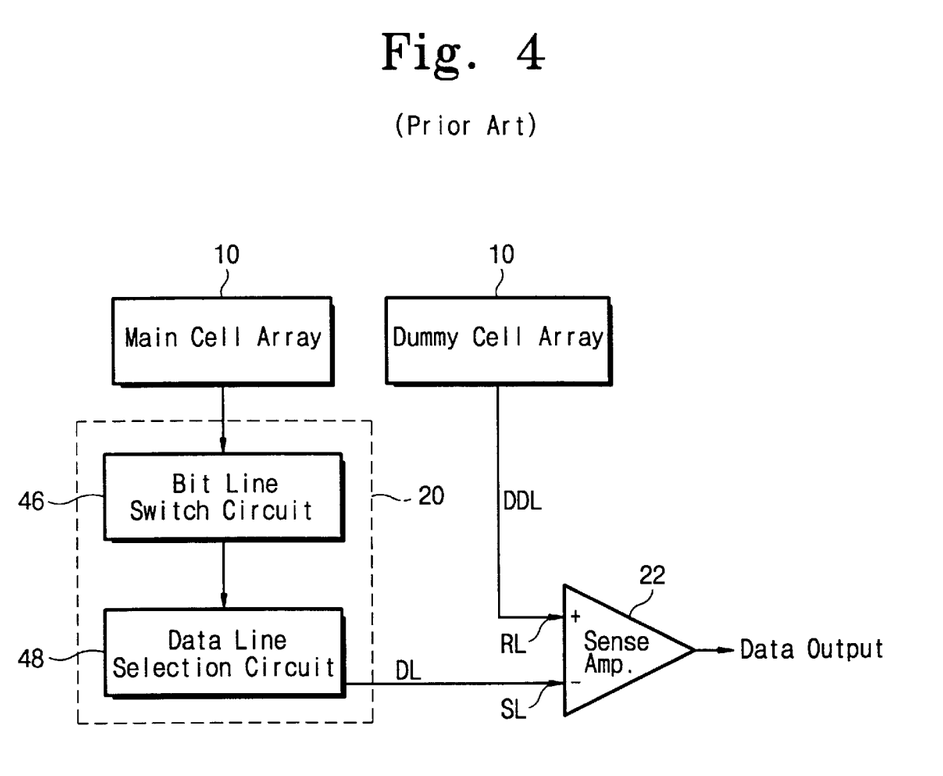
FIG. 4 is a functional block diagram illustrating data read-out circuitry used in the read-only memory of FIG. 1.
Figure 5:
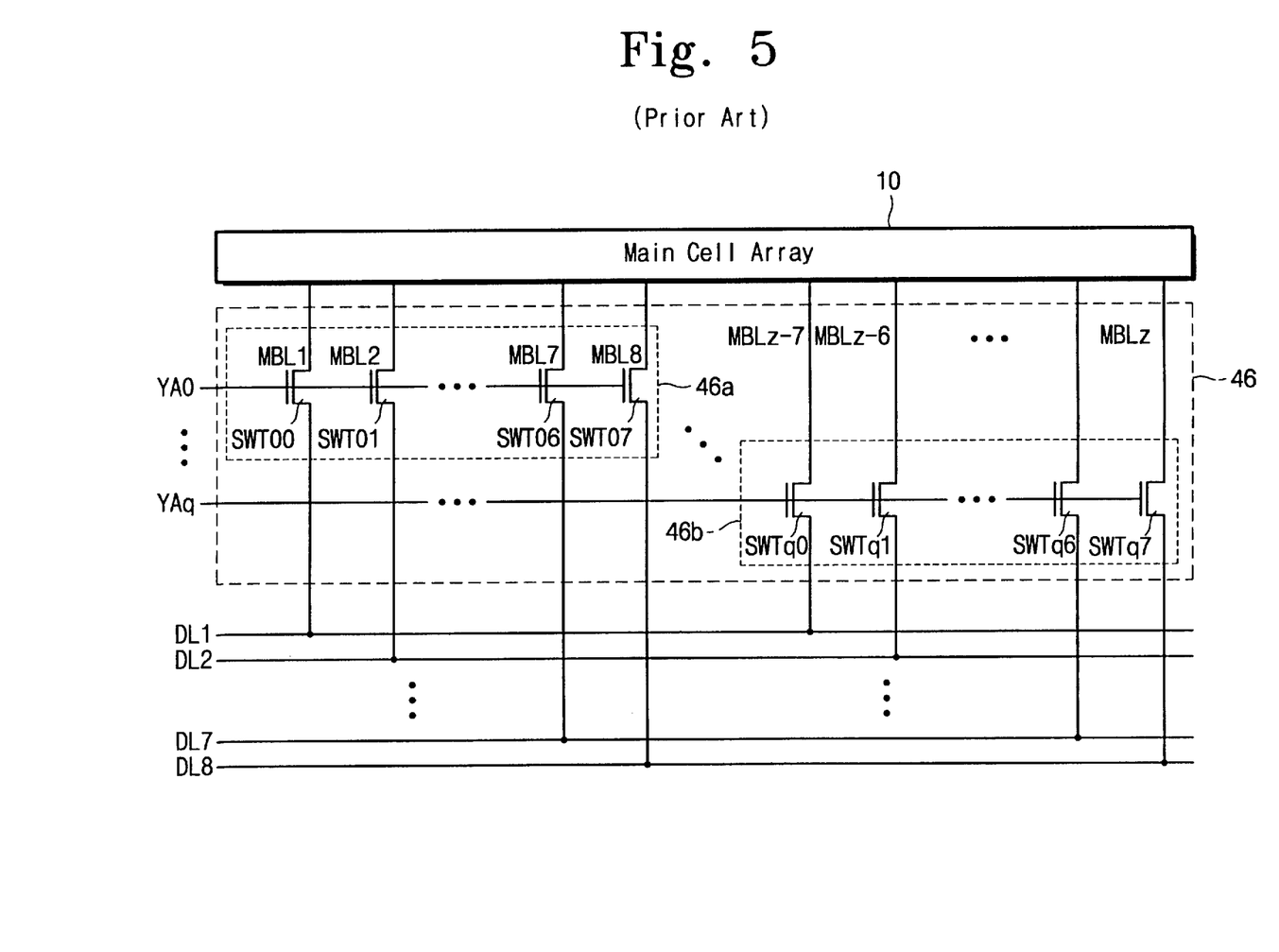
FIG. 5 is a detailed schematic block diagram of a bit line switching circuit in the read-only memory of FIG. 1.

FIG. 4 is a schematic block diagram of conventional circuitry used during a read-out operation. Referring to FIG. 4, data from a main memory cell array 10 selected by an address is transferred to sense line SL of sense amplifier circuit 22 through a column pass circuit 20 composed of a bit line switching circuit 46 and data line selection circuit 48. A reference line RL of the sense amplifier circuit 22 is connected to the dummy cell array 10 through dummy bit lines such as those shown in FIG. 3. FIG. 5 is a detailed schematic block diagram of a bit line switching circuit 46. The bit line switching circuit 46 responds to selection signals YA0–YAq to electrically connect the main bit lines MBL1, . . . , to data lines DL1, . . . .Each of the selection signals YA0–YAq controls a group of the main bit lines, and the groups are defined in switching blocks 46a, 46b. For example, a high level on YA0 activates a switching block 46a while other switching blocks are held in an inactive state because their selection signals are not enabled.

The number of main bit lines assigned to a switching group is variable according to an output data format. For example, an 8-bit memory device can have eight main bit lines in one switching block, and a 16-bit device can have sixteen main bit lines in a switching block. The number of the data lines, DL1–DL8, for example, is also compatible with the number of main bit lines in the block. In each of the switch blocks 46a, 46b, . . . , NMOS transistors SWTi0–SWTi7 are interposed between their corresponding main bit lines and data lines. The gates of the transistors in a block 46a, 46b, . . . are coupled to their corresponding selection lines YA0–YAq, as shown. Hence, a group of main bit lines is selected for connection to the data lines DL1–DL8 by a signal YA0–YAq, and the data lines are connected to a data line selection circuit 48, which selects one of the data lines to be transferred to the SL input of the sense amplifier 22.

Figure 6:
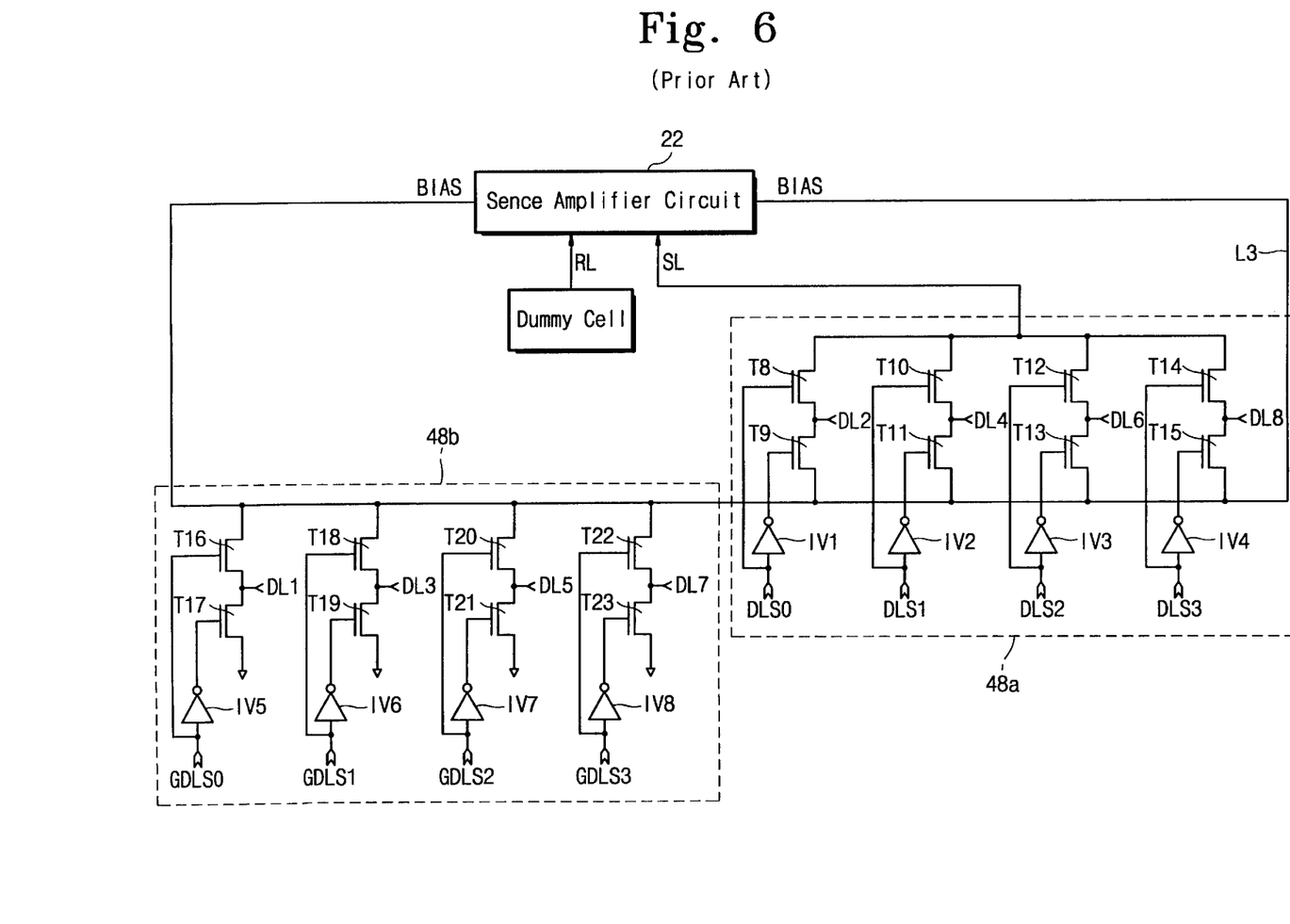
FIG. 6 is a detailed schematic block diagram of a data line selection circuit in the read-only memory of FIG. 1.

FIG. 6 is a detailed schematic block diagram of data line selection circuits 48a and 48b. Each of the selection circuits connects one of data lines DL1–DL8, corresponding to a selected memory cell, to sense amplifier circuit 22. Each circuit 46a, 46b also grounds data lines adjacent to the selected line and connects the other non-selected data lines to a bias line L3. One selection circuit 48a connects one of the even-numbered data lines DL2, DL4, DL6, DL8 assigned to its corresponding main bit lines to sensing line SL in response to selection signals DLS0, DLS1, DLS2 and DLS3. The second selector 48b connects one of odd-numbered data lines to ground.

The first selector 48a is connected to the even-numbered data lines DL2, DL4, DL6 and DL8, and includes inverters IV1, IV2, IV3 and IV4, corresponding to the even-numbered data lines, and NMOS transistors T8–T15. The pairs of the NMOS transistors, T8 and T9, T10 and T11, T12 and T13, and T14 and T15, are each connected between sensing line SL and bias line L3 in series, with common source nodes coupled to their corresponding data lines DL2, DL4, DL6 and DL8. Gates of the NMOS transistors T8, T10, T12 and T14 are each coupled to selection signals DLS0–DLS3, respectively. The drains of the transistors T8, T10, T12, and T14 are connected to sensing line SL which is connected to the sense amplifier circuit 22. The gates of NMOS transistors T9, T11, T13 and T15 are coupled to inverted signals of the selection signals DLS0–DLS3. The drains of the transistors T9, T11, T13 and T15 are connected to bias line 13.

When the selection signal DLS0, for example, is switched to a high state while DLS1, DLS2, DLS3 are maintained in a low state, NMOS transistors T8, T11, T13 and T15 are switched on while NMOS transistors T9, T10, T12 and T14 are switched off. As a result, the selected data line DL2 is connected to the sensing line SL while the other data lines DL4, DL6 and DL8 are connected to bias line L3.

The second selector 48b is connected of the odd-numbered data lines DL1, DL3, DL5 and DL7 and includes inverters IV5–IV8, corresponding to the odd-numbered data lines, and NMOS transistors T16–T23. The pairs of the NMOS transistors, T16 and T17, T18 and T19, T20 and T21, and T22 and T23, are each connected between the bias line L3 and ground in series, with common source nodes coupled to their corresponding data lines, DL1, DL3, DL5 and DL7. Gates of the NMOS transistors T16, T18, T20 and T22 are each coupled to selection signals GDL0–GDL3, respectively. The drains of the transistors T16, T18, T20 and T22 are connected to the bias line L3. The gates of the NMOS transistors T17, T19, T21 and T23 are coupled to inverted signals of the selection signals GDL0–GDL4, respectively. The drains of transistors T17, T19, T21, and T23 are connected to ground. When the selection signal GDL0, for example, is switched to a high state while GDL1, GDL2, and GDL3 are maintained in a low state, NMOS transistors T16, T19, T21 and T23 are switched on while NMOS transistors T17, T18, T20 and T22 are off. As a result, data line DL1 can be connected to bias line L3. Since NMOS transistors T17, T18, T20 and T22 are turned on while NMOS transistors T16, T19, T21 and T23 are off when GDL0 is in a low state and GDL1, GDL2, and GDL3 are high, a selected data line DL1 can be connected to ground while the other data lines DL3, DL5 and DL7 are connected to bias line L3.

Figure 7:
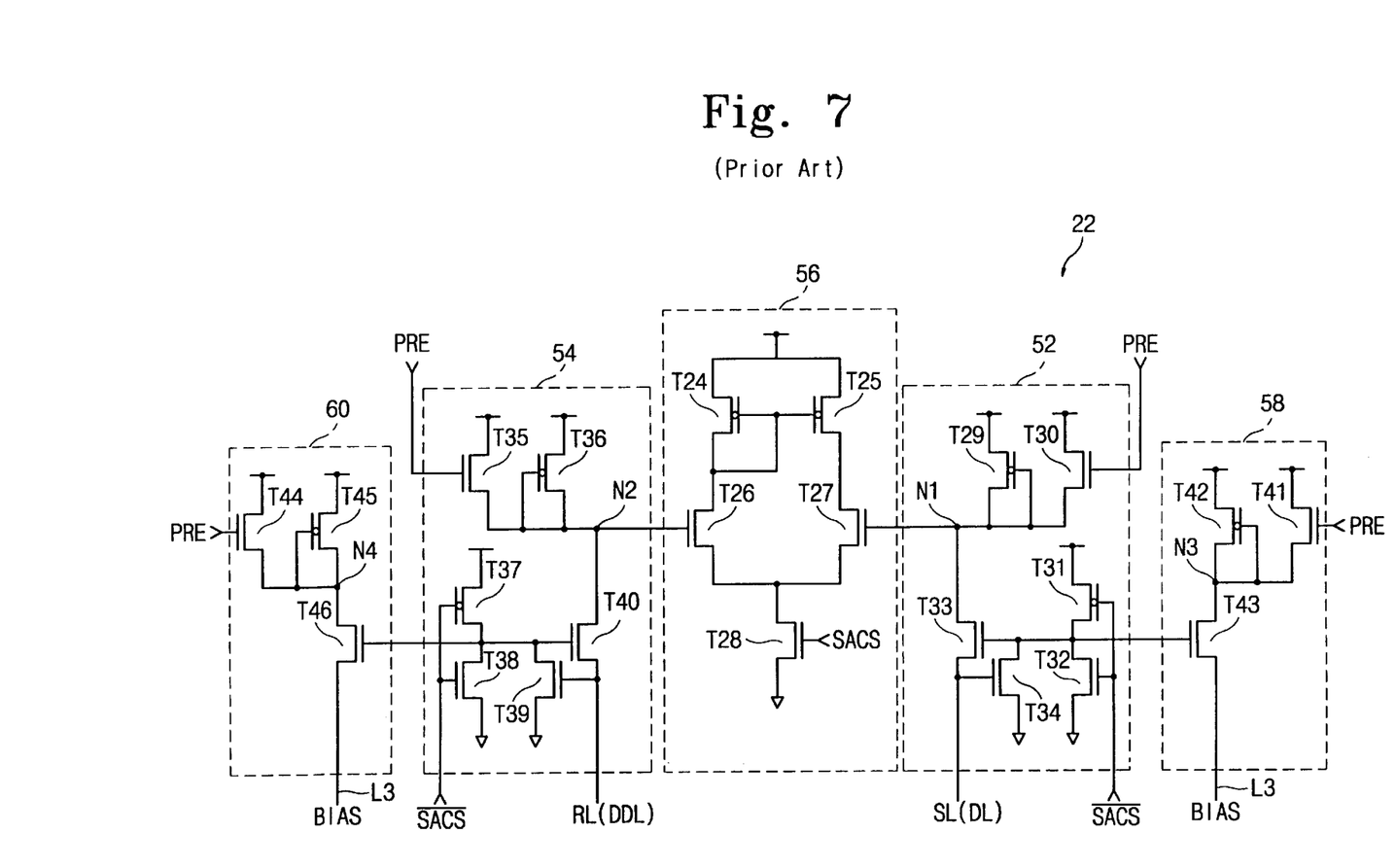
FIG. 7 is a detailed schematic block diagram of a sense amplifier in the read-only memory of FIG. 1.

FIG. 7 is a detailed schematic block diagram of a sense amplifier circuit 22. The sense amplifier circuit 22 is connected to sensing line SL, which is connected to a selected data line by the data line selection circuit 48, as described above in connection with FIG. 6 and a dummy data line (or reference line) DDL which receives a reference voltage from a dummy cell as shown in FIG. 3. The sense amplifier 22 also includes a first precharge circuit 52 for charging a corresponding main bit line during a bit line precharge cycle, a second precharge circuit 54 for charging a corresponding dummy bit line during a bit line precharge cycle, current-mirror-type differential amplifier 56, and first and second bias circuits 58 and 60.

The precharge circuit 52 includes four NMOS transistors, T30, T32, T33 and T34, and two PMOS transistors T29 and T31. NMOS transistor T30 is connected between a power supply and an input node N1 connected to the differential amplifier 56. The gate of T30 is coupled to precharge control signal PRE generated from the ATD circuit 30 of FIG. 1. PMOS transistor T29 is connected between a power supply and input node N1. The gate of T29 is also connected to node N1. NMOS transistor T33 is connected between input node N1 and sensing line SL. NMOS transistor T34, the gate of which is coupled to sensing line SL, is connected between the gate of NMOS transistor T33 and ground. NMOS transistor T32, the gate of which is coupled to complementary signal SACSB of sense amp control signal SACS generated from the ATD circuit, is connected between the gate of NMOS transistor T33 and ground. PMOS transistor T31, the gate of which is coupled to SACSB, is connected between the power supply and the gate of NMOS transistor T33.

The transistors T29 and T30 act as current sources for driving a predetermined amount of current into a main bit line during the bit line precharge cycle, and the transistors T31 through T33 cause voltage levels of their corresponding main and sub bit lines to be compared to a threshold level of T34.

Precharge circuit 54 includes four NMOS transistors T35, T38, T39 and T40 and two PMOS transistors T36 and T37, analogous to the transistors of the precharge circuit 52. NMOS transistor T35, the gate of which is coupled to precharge control signal PRE generated from the ATD circuit 30 of FIG. 1, is connected between a power supply and input node N2 connected to the differential amplifier 56. PMOS transistor T36, the gate of which is coupled to node N2, is connected between a power supply and input node N2. NMOS transistor T40 is connected between input node N2 and reference line RL (or dummy data line DDL). NMOS transistor T39, the gate of which is coupled to reference line RL, is connected between the gate of NMOS transistor T40 and ground. NMOS transistor T38, the gate of which is coupled to SACSB, is connected between the gate of NMOS transistor T40 and ground. PMOS transistor T37, the gate of which is coupled to SACSB, is connected between the power supply and the gate of NMOS transistor T40.

The transistors T35 and T36 act as current sources for driving a predetermined amount of current into a main bit line during the bit line precharge cycle, and the transistors T37 through T40 cause voltage levels of their corresponding main and sub bit lines to be compared to a threshold level of T39.

Differential amplifier 56 includes a pair of PMOS transistors T24 and T25, NMOS transistors, T26 and T27, each connected to T24 and T25, and NMOS transistor T28 connected between a common node of T26 and T27 and ground. T26 and T27 are typically fabricated to have identical electrical properties. The gate of T26 is coupled to reference line RL (or dummy data line DDL) through T40. The gate of T27 is coupled to sense line SL (or data line DL) through T33. The gate of T28 is coupled to sense amp control signal SACS.

A first bias circuit 58 includes two NMOS transistors T41 and T43 and PMOS transistor T42. NMOS transistor T41, the gate of which is coupled to precharge control signal PRE, is connected between the power supply and node N3. The source of PMOS transistor T42, whose gate and drain are connected in common at node N3, is connected to the power supply. NMOS transistor T43, the gate of which is coupled to the drain of T34 of the first precharge circuit 52, is connected between node N3 and bias line L3 of the data line selection circuit 48.

The second bias circuit 60 is formed of two NMOS transistors T44 and T46 and PMOS transistor T45. NMOS transistor T44, the gate of which is coupled to precharge control signal PRE, is connected between the power supply and node N4. The source of T45, whose gate and drain are connected in common at node N4, is connected to the power supply. NMOS transistor T46, the gate of which is coupled to the drain of T39 of the second precharge circuit 54, is connected between node N4 and bias line L3 of the data line selection circuit 48.

The read-only memory described above in connection with FIGS. 1–7 requires one dummy data line (or reference line) for one sense amplifier circuit in order to detect data stored in a memory cell selected by address signals. The number of the sense amplifier circuit and dummy data lines is generally determined by the type of data-out module employed in a memory, e.g., one-of-eight, one-of-sixteen, one-of-thirty-two. Such a direct increase in the number of the dummy data lines with respect to the number of sense amplifier circuits may cause the area occupied by a memory cell array to be increased, resulting in difficult circuit design and decreased integration density.

SUMMARY OF THE INVENTION

Accordingly, it is an object of the invention to provide a read-only memory circuit which can be implemented with high integration density.

It is another object of the invention to provide a read-only memory without a direct increase of the number of dummy data lines with respect to increases of the number of sense amplifiers therein.

A read-only memory (ROM) in accordance with the invention includes a main memory cell array having a plurality of memory cells for storing a respective plurality of data bits. The memory cell array includes a plurality of main bit lines for transferring data bits into and out of the main memory cell array. The ROM of the invention also includes a dummy cell array having a plurality of dummy cells for generating dummy cell data. The dummy cell data include reference potentials for comparison to data bits stored in corresponding cells of the main memory cell array. A sense amplifier circuit is used to compare a data bit on a sense line from a memory cell to dummy cell data from a dummy cell which corresponds to the main memory cell. The dummy cell data is received for comparison on a reference line connected to the sense amplifier circuit. A selection circuit is used to couple the dummy cell to one of the main bit lines of the main memory cell array such that said one of the main bit lines is coupled to the reference line of the sense amplifier circuit.

In one embodiment, the selection circuit comprises a decoder circuit which selects one of the main bit lines of the main memory cell array for connection to one of the dummy cells of the dummy cell array. The ROM of the invention also includes a switching circuit for connecting the one of the main bit lines to one of a plurality of data lines of the memory. A second switching circuit can be used to connect the one of the data lines to the reference line of the sense amplifier circuit, such that the dummy data from the selected memory cell can be connected to the sense amplifier circuit via the reference line. In one embodiment, the second switching circuit can also connect another of the data lines of the memory to ground.

BRIEF DESCRIPTION OF THE DRAWINGS

For a better understanding of the invention, and to show how embodiments of the same may be carried into effect, reference will now be made, by way of example, to the accompanying diagrammatic drawings. Throughout the drawings, like reference numerals denote like or corresponding parts.

DETAILED DESCRIPTION OF THE PREFERRED EMBODIMENTS

Figure 8:
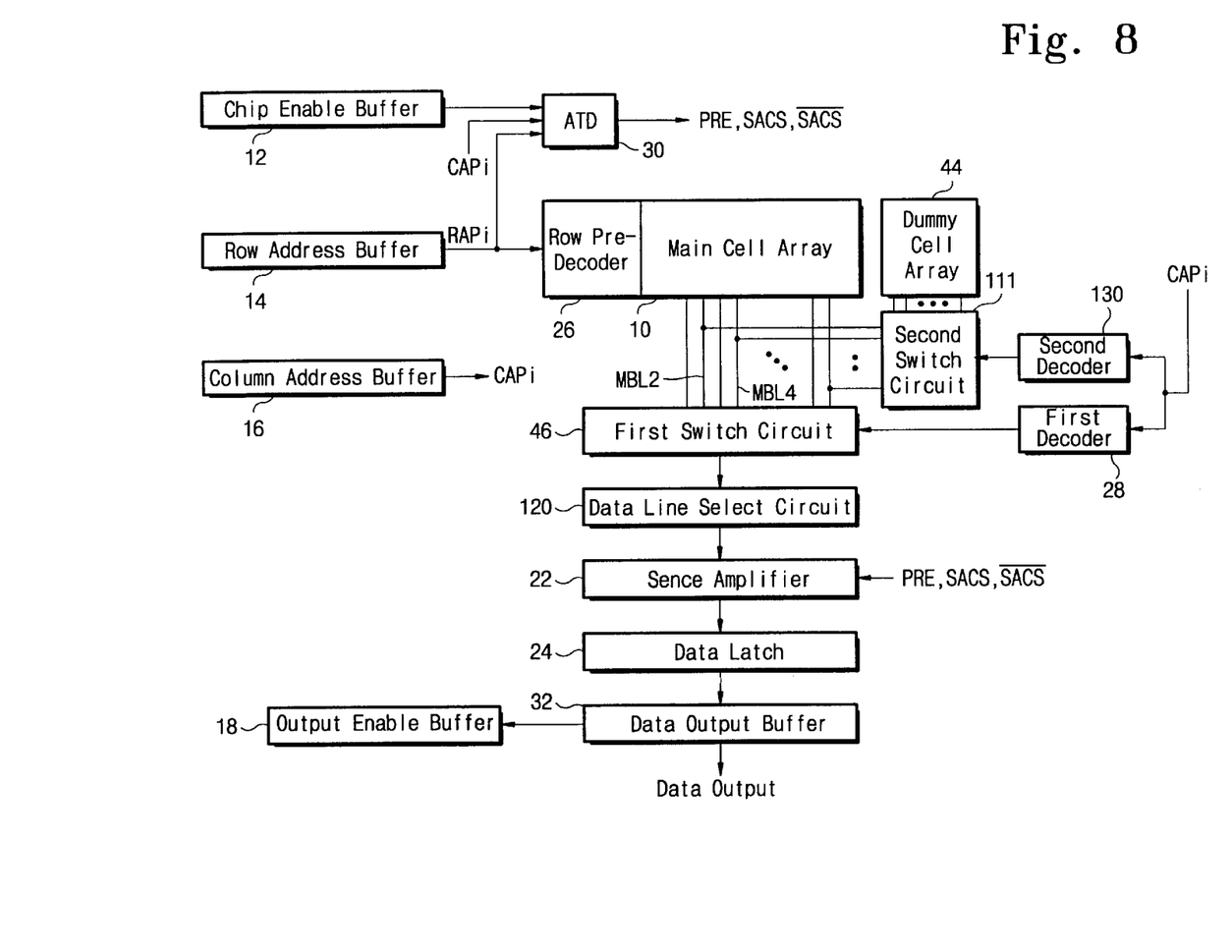
FIG. 8 is a schematic block diagram illustrating a read-only memory according to one embodiment of the invention.
Figure 9:
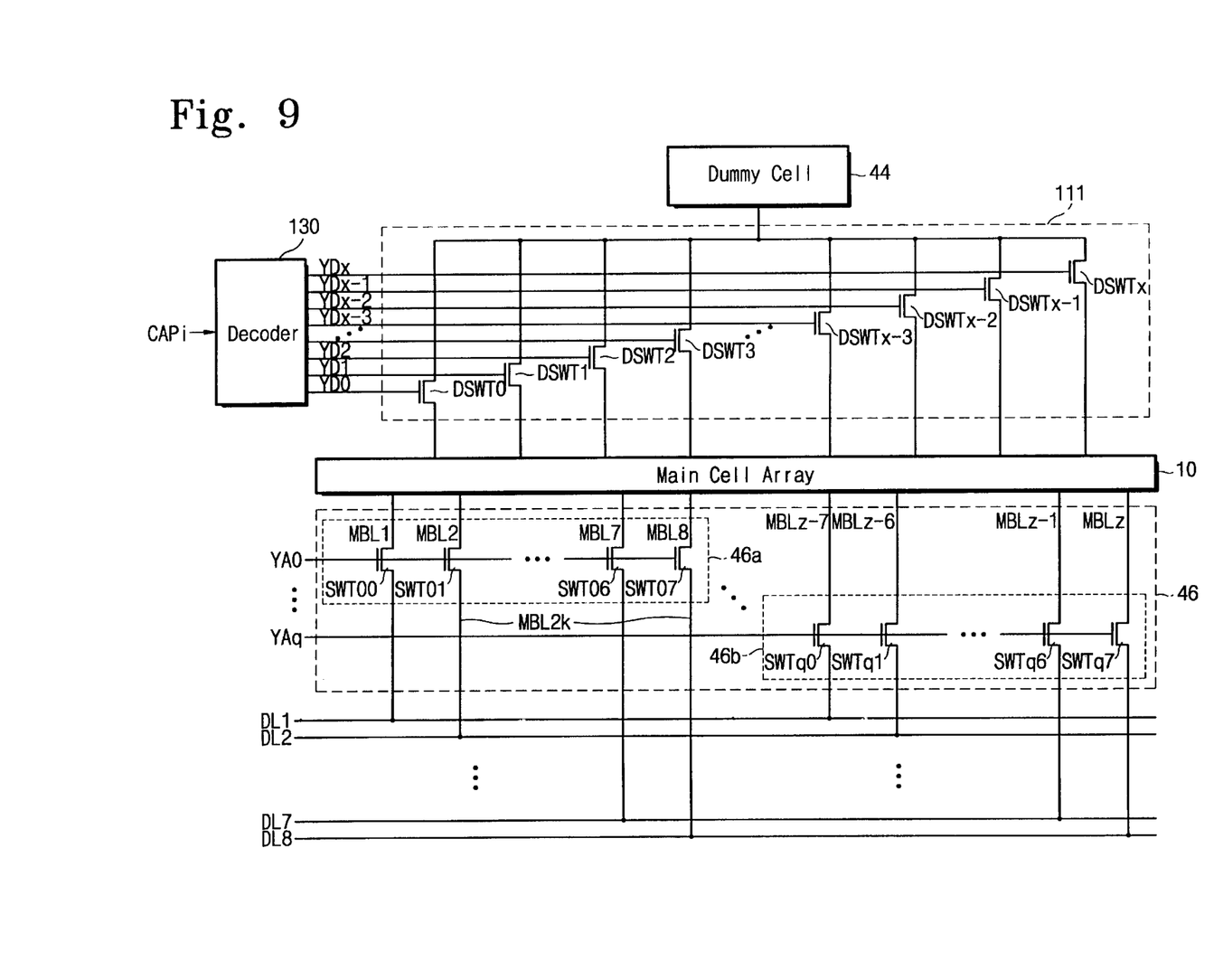
FIG. 9 is a schematic block diagram of first and second switching circuits associated with the main cell array and dummy cell array in the read-only memory of FIG. 8.
Figure 10:
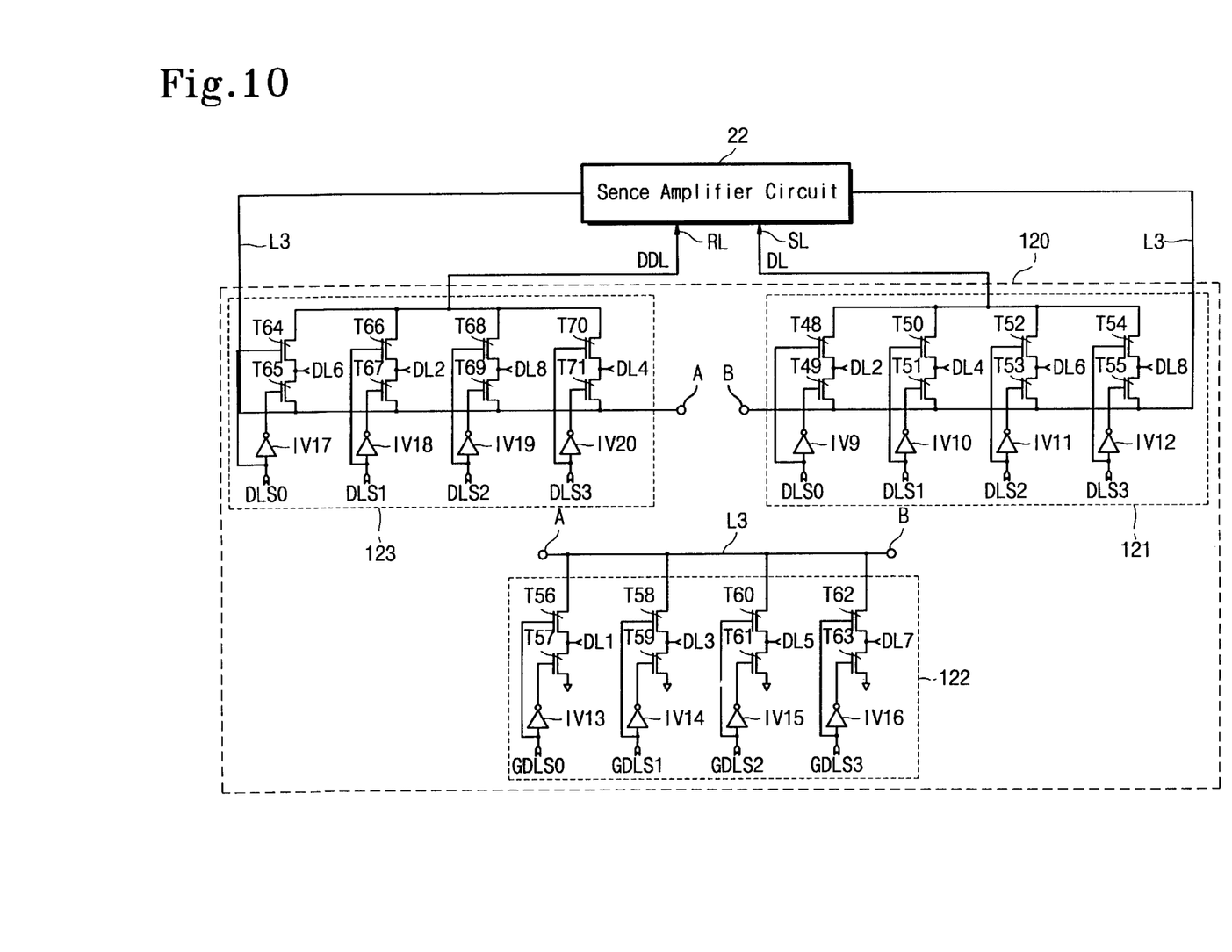
FIG. 10 is a schematic block diagram of a data line selection circuit in the read-only memory of FIG. 8.

FIG. 8 is a schematic block diagram of one embodiment of a read-only memory (ROM) in accordance with the invention. FIG. 9 is a schematic diagram of one embodiment of switching circuits in the ROM of FIG. 8, and FIG. 10 is a schematic diagram of one embodiment of a data line selection circuit in the ROM of FIG. 8. Referring to FIGS. 8–10, the invention provides a switching circuit 11 for connecting dummy cells to a reference line of sense amplifier circuit 22 through main bit lines of main cell array 10, without constructing the dummy data lines within the area of the memory cell array. The switching circuit 111 is designed to select, out of main bit lines assigned to a selected one of switching blocks 46a–46b in bit line switching circuit 46, one of the main bit lines, excluding a pair of the main bit lines used in data accessing in a read operation, in order to make the selected main bit line act as a dummy data line.

FIG. 8 shows a functional construction of one embodiment of a ROM in accordance with the invention, in which buffers 12, 14, 16 and 18, main cell array 10, sense amplifier circuit 22, data latch 24, first decoder (i.e., column decoder) 28, data output buffer 32, dummy cell array 44 and the first bit line switching circuit 46 are all similar to those circuits corresponding in FIGS. 1–7. The second switching circuit 111 selects one of even-numbered main bit lines MBL2k (kO) in response to selection signal YDx generated from a second decoder 130 and then connects a dummy cell through reference line RL to sense amplifier 22 through the selected even-numbered main bit line and first switching circuit 46.

Referring FIG. 9 the second bit line switching circuit 111 has NMOS transistors DSWT0–DSWTx connected between dummy cell array 44 and the even-numbered main bit lines MBL2k. Selection signals YD0–YDx are applied to the gates of the NMOS transistors DSWT0–DSWTX. Assuming that when switching block 46a is selected in the first bit line switching circuit 46, main bit line MBL1 is grounded and main bit line MBL2 adjacent to the MBL1 is connected to sensing line SL of sense amplifier circuit 22, one of the NMOS transistors DSWT1–DSWT3 corresponding to even-numbered main bit lines MBL4, MBL6 and MBL8, respectively, out of the main bit lines MBL3–MBL8, belongs to the selected switching block 46a, e.g., DSWT2, becomes conductive by selection signal YD2 generated from the second decoder circuit 130, and thereby the main bit line assigned to a dummy cell is coupled to reference line RL as an input of sense amplifier circuit through the conductive NMOS transistor (e.g., DSWT2).

Referring to FIG. 10, data line selection circuit 120 according to the invention connects one of even-numbered data lines DL2, DL4, DL6 and DL8 in data lines DL1–DL8 corresponding to main bit lines MBL1–MBL8 of the switching block (e.g., 46a), e.g., DL2, corresponding to a selected memory cell, to sensing line SL of sense amplifier circuit 22. The selection circuit 120 also grounds a data line, e.g., DL1, adjacent to the selected data line DL1, and provides one of the other data lines, DL4, DL6 and DL8 but not the selected data line DL2, to sense amplifier circuit 22 as a reference line.

Specifically, in the circuit of FIG. 10, first selector 121 connects one of even-numbered data lines DL2, DL4, DL6 and DL8 in data lines DL1–DL8 corresponding to the selected main bit lines to reference line SL of sense amplifier 22, in response to selection signals DLS0–DLS3. The second selector 122 connects one of odd-numbered data lines DL1, DL3, DL5 and DL7 to ground in response to selection signals GDLS0, GDLS1, GDLS2 and GDLS3. The third selector 123 connects one of the other even-numbered data lines, excluding the line selected by the first selector 121, to reference line RL of sense amplifier circuit 22.

The first selector 121 includes inverters IV9, IV10, IV11 and IV12 and pairs of NMOS transistors T48 and T49, T50 and T51, T52 and T53, and T54 and T55. The second selector 122 includes inverters IV13, IV14, IV15 and IV16 and pairs of NMOS transistors T56 and T57, T58 and T59, T60 and T61, and T62 and T63. The manner of interconnecting between the first and second selectors is similar to that shown in FIG. 6.

In the third selector 123, the arrangement of the even-numbered data lines is different from that of the first selector 121. In the third selector 123, the data lines are arranged in the order DL6, DL2, DL8 and DL4, with each corresponding to a respective selection signal GDLS3, GDLS2, GDLS1 and GDLS0. As a result of the arrangement of the data lines in the third selector 123, one of the data lines, excluding the even-numbered data lines selected by the first selector 121, can be selected in the third selector 123. The order of the data lines assigned to the third selector 123 shown in FIG. 10, i.e., DL6, DL2, DL8 and DL4, is used for purposes of illustrating the invention only and not as a limitation. Other orders can be used.

When, in the first selector 121, DLS0 assumes a high state while DLS1, DLS2 and DLS3 are low, T48, T51, T53 and T55 are turned on while T49, T50, T52 and T54 are non-conductive. As a result, DL2 is then connected to sensing line SL of sense amplifier circuit 22, and DL4, DL6 and DL8 are connected to bias line L3. Meanwhile, in the second selector 122, when GDLS0 becomes low while GDLS1, GDLS2, and GDLS3 are high, T57, T58, T60 and T62 are turned on while T56, T59, T61 and T63 are turned off. As a result, DL1 is grounded and DL3, DL5 and DL7 are connected to bias line L3. At the same time, since DLS0 applied to the first selector 121 is high, T70 of the third selector 123 becomes conductive to connect DL6 reference line RL of sense amplifier 22.

Figure 11:
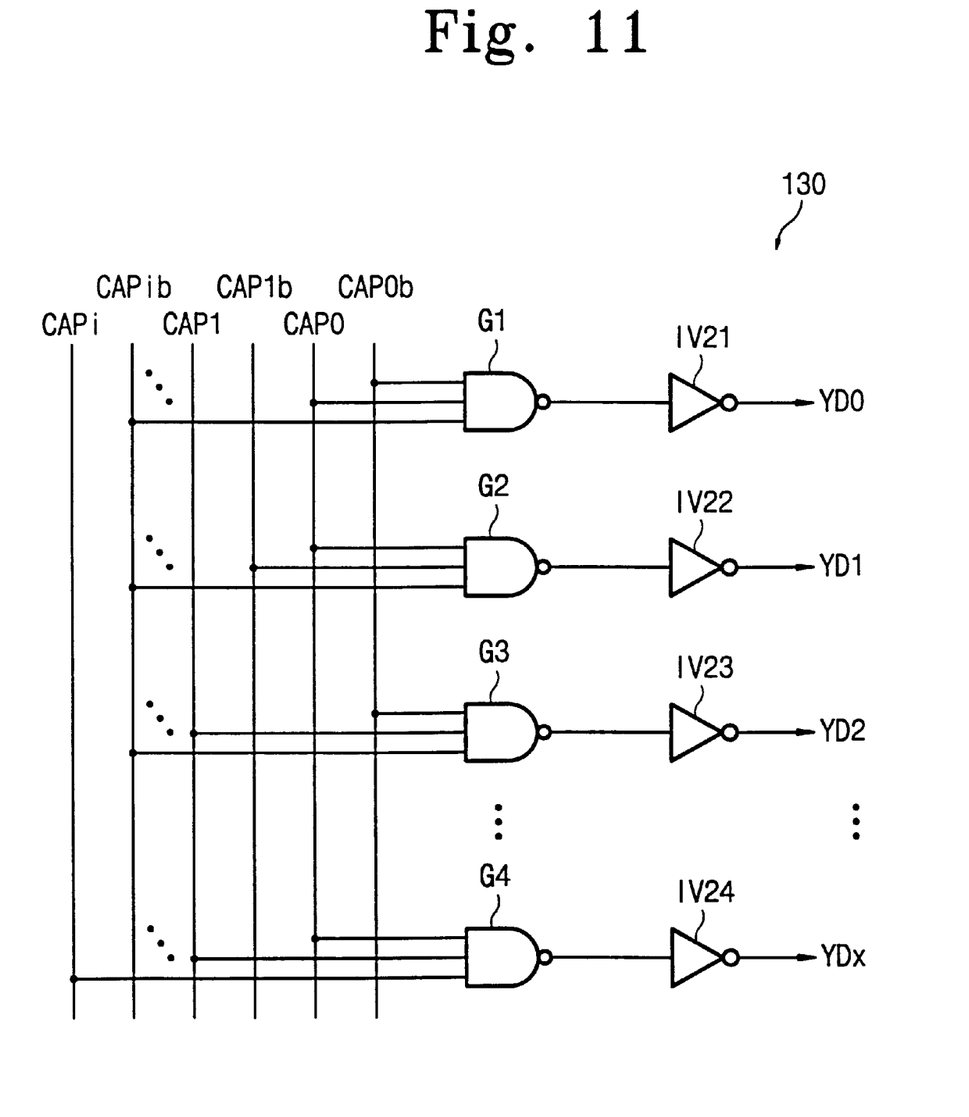
FIG. 11 is a schematic block diagram of a second decoder in the read-only memory of FIG. 8.
Figure 12:
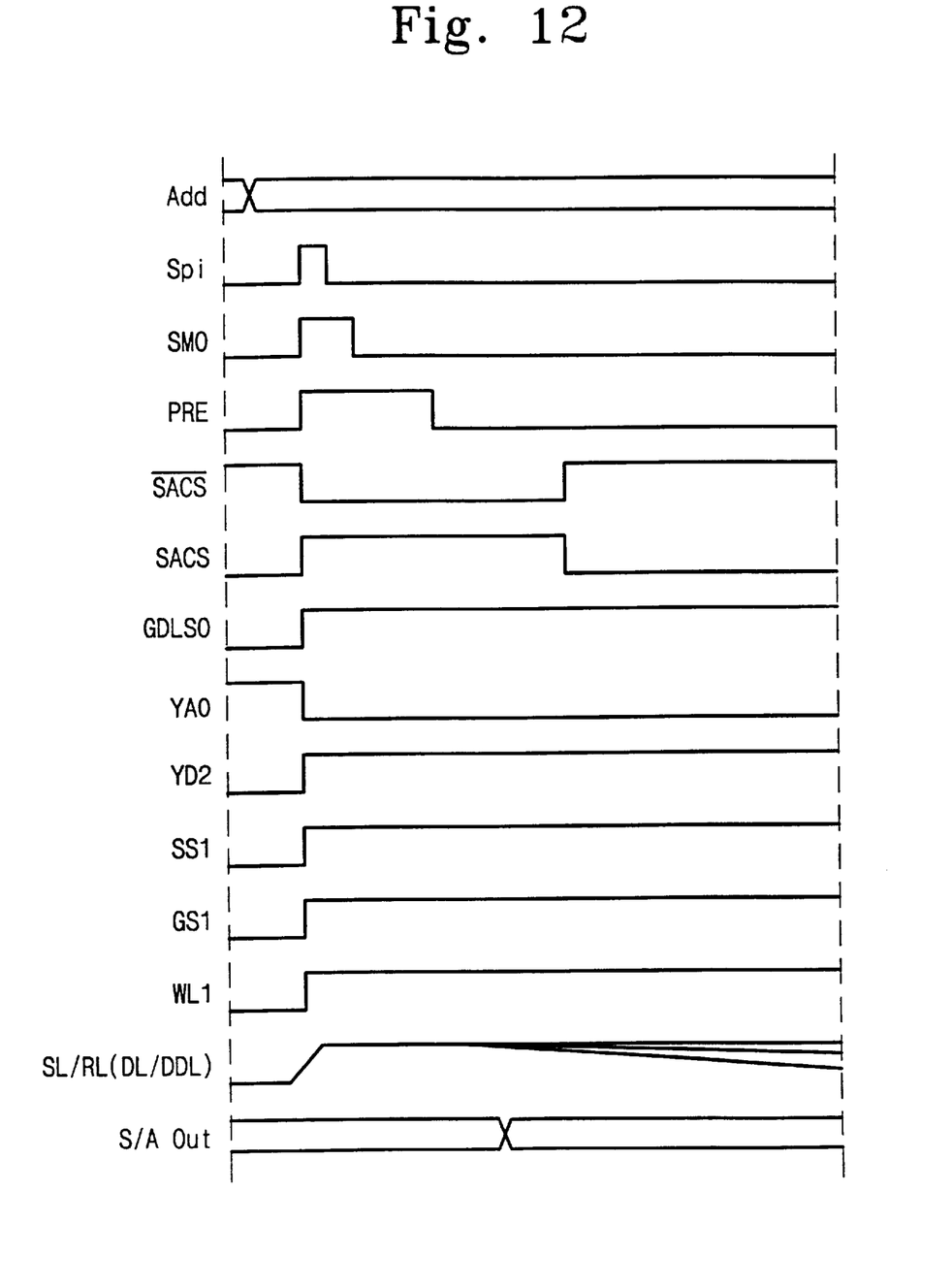
FIG. 12 is a timing diagram illustrating logical timing of a data read-out process in accordance with the invention.

FIG. 11 contains a schematic block diagram of one embodiment of the second decoder circuit 130, used to select one of the NMOS transistors of the second bit line switching circuit 111. The decoder 130 includes inverters IV20–IV23 which receive outputs of NAND gates G1–G4, respectively, which receive address signals CAP0, CAP1, .... Referring to FIG. 12, which contains a timing chart of signals during a read-out operation, assuming, for example, that memory cell M13 of FIG. 2 is selected, a transition of an external address signal causes precharge control signal PRE and sense amp control signals SACS and SACSB to be generated from address transition detecting circuit 30. Signals PRE, SACS and SACSB are high, high and low, respectively. As a result, the first and second precharge circuits 52 and 54 are activated to perform precharge functions. Consequently, selection transistors ST2, ST3, . . . , GT1, GT3, . . . in the main cell array 10 are turned on by selection signals SS2 and BS1, and memory cells coupled to the selected word line WL0 are activated. Also, YA0, which is generated from column pre-decoder circuit 28 assumes a high state to activate NMOS transistors SWT00–SWT07 of switching block 46a. Main bit lines MBL1–MBL8 are connected to their corresponding data lines DL1–DL8, respectively.

Responding to a rising transition of selection signals DLS0, T48 of the first selector 121 is turned on and DL2 is connected to reference line RL, which is input to sense amplifier circuit 22. Also, a low level on GDLS0 causes T57 to be switched on to connect DL1 to ground. At the same time, since DLS0 rises to a high level, T70 of the third selector 123 is switched on to connect DL6 to reference line RL of sense amplifier circuit 22. At this time, as YD2 generated from the second decoder circuit 130 switches to high, DSWT2 of the second bit line switching circuit 111 is turned on. As a result, MBL6, corresponding to DL6 selected by the third selector 123, is connected to a dummy cell.

If the amount of current passing through a dummy cell connected to MBL6 is smaller than that through the selected memory cell M13, the sense amplifier circuit 22 detects M13 as an on-cell which stores data "1". On the other hand, if the current of the selected memory cell M13 is smaller than that of the dummy cell, the cell M13 is detected by the sense amplifier circuit 22 as an off-cell, storing data "0".

As described above, the read-only memory according to the invention has an advantage that it is possible to accomplish an efficient read-out operation without additional dummy bit lines in an area of the memory cell array, so that an integration density of such a memory can be enhanced.

Although specific constructions of the invention have been illustrated and described herein, it is not intended that the invention be limited to the elements and constructions disclosed. One skilled in the art will recognize that the particular elements or subconstruction may be used without departing from the scope and spirit of the invention.

What is claimed is:

1. A semiconductor read-only memory, comprising:
   a main memory cell array having a plurality of memory cells for storing data, the memory cell array comprising a plurality of main bit lines for transferring data into and out of the main memory cell array;
   a dummy cell array for generating dummy cell data, said dummy cell data including a reference potential for comparison to data stored in a cell of the main memory cell array;
   a sense amplifier circuit having a sense input and a reference input, said sense amplifier circuit comparing data on the sense input from a memory cell to dummy cell data from a dummy cell, said dummy cell data being received on the reference input of the sense amplifier circuit; and
   a selection circuit for coupling the dummy cell to one of the main bit lines of the main memory cell array, said first main bit line being coupled to the reference input of the sense amplifier circuit.

2. The memory of claim 1, wherein the selection circuit comprises:
   a first selection part for selecting the first main bit line connected to the dummy cell; and
   a second selection part for selecting a second and a third main bit line of the main bit lines.

3. The memory of claim 2, wherein the first selection part comprises:
   a decoder for generating selection signals in response to a column address; and
   a switching circuit for coupling the first main bit line to the dummy cell in response to the selection signals.

4. The memory of claim 2, wherein the second selection part comprises:
   a decoder for generating first and second selection signals in response to a column address;
   a bit line switching circuit for coupling the main bit lines to data lines of the memory, respectively, in response to the first selection signals; and
   a data line selection circuit operated in response to the second selection signals, wherein the data line selection circuit couples a data line corresponding to the first main bit line to the reference input of the sense amplifier and a second data line corresponding to the second main bit line to the sense input of the sense amplifier, and grounds a data line corresponding to the third main bit line.

* * * * *